United States Patent [19]
Unami et al.

[11] Patent Number: 6,111,343
[45] Date of Patent: Aug. 29, 2000

[54] PIEZOELECTRIC RESONATOR AND ELECTRONIC COMPONENT INCLUDING SAME

[75] Inventors: Toshihiko Unami, Omihachiman; Toshiyuki Baba, Moriyama; Toshio Nishimura, Shiga-ken; Tatsunori Kakuda, Takaoka, all of Japan

[73] Assignee: Murata Manufacturing Co., Ltd., Japan

[21] Appl. No.: 09/137,173

[22] Filed: Aug. 20, 1998

[30] Foreign Application Priority Data

Oct. 1, 1997 [JP] Japan ..................... 9-286178

[51] Int. Cl.$^7$ .................................................. H01L 41/04
[52] U.S. Cl. ............................................ 310/366; 310/328
[58] Field of Search ............................. 310/366, 344, 310/348, 328

[56] References Cited

U.S. PATENT DOCUMENTS

| | | | |
|---|---|---|---|
| 5,153,477 | 10/1992 | Jomura et al. ........................ | 310/328 |
| 5,406,164 | 4/1995 | Okawa et al. ........................ | 310/366 |
| 5,459,371 | 10/1995 | Okawa et al. ........................ | 310/363 |
| 5,925,971 | 7/1999 | Unami ................................... | 310/328 |

*Primary Examiner*—Nicholas Ponomarenko
*Assistant Examiner*—Peter Medley
*Attorney, Agent, or Firm*—Graham & James LLP

[57] ABSTRACT

A piezoelectric resonator includes a base member including a plurality of laminated piezoelectric layers and internal electrodes. The adjacent piezoelectric layers are polarized in different directions with an internal electrode disposed therebetween. A groove is provided on one lateral surface of the base member, and every other internal electrode is exposed at both sides of the groove. Insulating films are disposed on unexposed portions of the internal electrodes. External electrodes are provided on both sides of the groove in the base member and are connected to the internal electrodes. As a result of this structure, the piezoelectric resonator prevents a reduction in the difference ΔF between the resonant frequency and the anti-resonant frequency.

20 Claims, 16 Drawing Sheets

PIEZOELECTRIC RESONATOR AND ELECTRONIC COMPONENT INCLUDING SAME

BACKGROUND OF THE INVENTION

1. Technical Field of the Invention

The present invention relates to a piezoelectric resonator which is adapted to vibrate in a longitudinal vibration mode, and electronic components including such a piezoelectric resonator.

2. Description of the Related Art

Piezoelectric resonators utilizing mechanical resonance of a piezoelectric member include, for example, a piezoelectric resonator in which electrodes are provided on both surfaces of a piezoelectric plate which is polarized along a thickness direction thereof. In this type of piezoelectric resonator, an AC electric field is applied between the electrodes to excite a longitudinal vibration or a lateral vibration. However, this type of piezoelectric resonator utilizes an unstiffened mode in which the direction of an electric field and the direction of polarization are different from the direction of vibration. As a result, this type of piezoelectric resonator has a small electromechanical coupling coefficient and a relatively small difference $\Delta F$ between the resonant frequency and the anti-resonant frequency.

The use of such an unstiffened-mode piezoelectric resonator in an oscillator or a filter disadvantageously results in a small bandwidth and a low degree of flexibility in designing the electronic component characteristics. To overcome such disadvantages, there has been proposed a piezoelectric resonator having a laminated structure, such as the one shown in FIG. 15, which is a stiffened-mode piezoelectric resonator having a large electromechanical coupling coefficient and a relatively large difference $\Delta F$ between the resonant frequency and the anti-resonant frequency.

FIG. 15 is an illustration showing an example of a piezoelectric resonator utilizing the stiffened mode. A piezoelectric resonator 1 includes a rectangular-shaped base member 2. The base member 2 is formed by alternately laminating a plurality of piezoelectric layers 3 and a plurality of internal electrodes 4. Two piezoelectric layers 3 that are adjacent to each other with one internal electrode 4 therebetween are polarized in opposite directions in the longitudinal direction of the base member 2. A groove 5 is formed on one lateral surface of the base member 2, and the internal electrodes 4 are exposed at every other layer on both lateral surfaces of the groove 5. Further, on both sides of the grooves 5, external electrodes 6a and 6b are provided on the lateral surface of the base member 2. Accordingly, the adjacent internal electrodes 4 are connected to the different external electrodes 6a and 6b, respectively.

In the piezoelectric resonator 1, a signal is input into the external electrodes 6a and 6b, thereby applying an AC electric field between the adjacent internal electrodes 4. Since the adjacent piezoelectric layers 3 are polarized in opposite directions, upon applying an AC electric field to the layer 3, the individual piezoelectric layers 3 expand or contract in the longitudinal direction of the base member 2. As a result, a longitudinal fundamental vibration is generated in the entire piezoelectric resonator 1. In this manner, the piezoelectric resonator 1, which utilizes the stiffened mode in which the direction of an electric field and the direction of polarization coincide with the direction of vibration, can increase the electromechanical coupling coefficient and $\Delta F$ in comparison with an unstiffened-mode piezoelectric resonator. Thus, the use of a stiffened-mode piezoelectric resonator in an oscillator or a filter makes it possible to increase the bandwidth and increase the degree of flexibility in designing the component characteristics.

In the above type of piezoelectric resonator, however, a capacitance is generated between the unexposed portion of each internal electrode and the external electrode which is not connected to the unexposed internal electrode. This capacitance is unfavorably connected in parallel to the capacitance between the internal electrodes, which causes vibration, thereby lowering the capacitance ratio of the resonator and further decreasing the difference $\Delta F$ between the resonant frequency and the anti-resonant frequency. This results in a small bandwidth when the piezoelectric resonator is used in an oscillator or a filter.

SUMMARY OF THE INVENTION

To overcome the problems described above, the preferred embodiments of the present invention provide a piezoelectric resonator which prevents any decrease in the difference $\Delta F$ between the resonant frequency and the anti-resonant frequency and provides an electronic component including such a novel piezoelectric resonator and having a high degree of flexibility in designing the bandwidth of the component.

The present invention provides a piezoelectric resonator including a base member having a longitudinal direction and including a plurality of laminated piezoelectric layers and internal electrodes; a first group of the internal electrodes and a second group of the internal electrodes being exposed at respective first and second regions of a surface of the base member; first and second external electrodes respectively disposed on the first and second regions so as to be connected to the first and second group of the internal electrodes; the piezoelectric layers being polarized in the longitudinal direction of the base member, an electric field being applied to the base member along the longitudinal direction to generate a longitudinal vibration in base member; wherein an insulating film is arranged to cover an unexposed portion of each of the first and second group of the internal electrodes; and the insulating film is disposed on each of the first and second regions and has a dielectric constant smaller than a dielectric constant of the piezoelectric layers.

The preferred embodiments of the present invention further provide a piezoelectric resonator constructed as described in the preceding paragraph and, which is characterized in that first and second conductive resin films are respectively disposed on the first and second regions continuously so as to be connected to the external electrodes.

In the above-described piezoelectric resonators, the first and second regions may be respectively located at a first side and at a second side in a widthwise direction of the base member on the same lateral surface of the base member.

Alternatively, the first and second regions may be respectively located on different lateral surfaces of the base member.

The preferred embodiments of the present invention further provide an electronic component including the above-described novel piezoelectric resonator, wherein the electronic component includes a substrate provided with a pattern electrode to which the conductive resin films are electrically connected, and the substrate and the piezoelectric resonator are covered via a cap. In such an electronic component, a plurality of the pattern electrodes may be provided on the substrate, and the conductive resin films of a plurality of the piezoelectric resonators may be electrically connected to the pattern electrodes so that a ladder filter is provided. When four piezoelectric resonators are utilized, first, second, third and fourth base members may be provided as the base members; first, second, third and fourth pattern electrodes may be provided as the electrodes on the substrate; the first base member may be mounted on the first and second pattern electrodes; the second base member may be mounted on the second and third pattern electrodes; the third base member may be mounted on the second and fourth pattern electrodes; and the fourth base member may be mounted on the third and fourth pattern electrodes.

According to a piezoelectric resonator of preferred embodiments of the present invention, an insulating film, which is made from, for example, a resin having a dielectric constant smaller than that of the piezoelectric layers, is disposed on an unexposed portion of each internal electrode. Accordingly, the insulating film having a small dielectric constant is disposed between the unexposed portions of the internal electrodes and the external electrode which are not connected to the unexposed portions of the internal electrodes, thereby decreasing the capacitance generated therebetween.

Further, in the conductive resin, metal particles are preferably uniformly distributed in the insulating resin having a dielectric constant smaller than that of the piezoelectric layers, as in the above-described insulating film. Thus, the metal particles in the conductive resin films disposed on the lateral surface of the base member are almost in point-contact with the base member, thereby significantly decreasing the area of contact in comparison with a piezoelectric resonator in which external electrodes are disposed on the lateral surface of the base member.

Accordingly, even if the conductive resin films are deposited on the unexposed portions of the internal electrodes of the lateral surface of the base member, the capacitance generated between the conductive resin films and the unexposed portions of the internal electrodes is significantly reduced.

Because of the arrangement of the external electrodes connected to the exposed internal electrodes on the lateral surface of the base member, the internal electrodes can be connected to the conductive resin films with the external electrodes disposed therebetween, thereby enhancing an electrical connection between the conductive resin films and the exposed internal electrodes.

The first and second regions where the first and second groups of the internal electrodes are exposed may be located on different lateral surfaces or the same surface of the base member according to a desired purpose or use of the piezoelectric resonator.

An electronic component, such as an oscillator, a discriminator, or a ladder filter, is manufactured to include the above-described novel piezoelectric resonator. This electronic component achieves substantially no decrease in the difference ΔF between the resonant frequency and the anti-resonant frequency of the piezoelectric resonator and has a high flexibility in designing a desired bandwidth.

Other features and advantages of the present invention will become apparent from the following description of preferred embodiments of the invention which refers to the accompanying drawings.

DETAILED DESCRIPTION OF PREFERRED EMBODIMENTS

Figure 1:
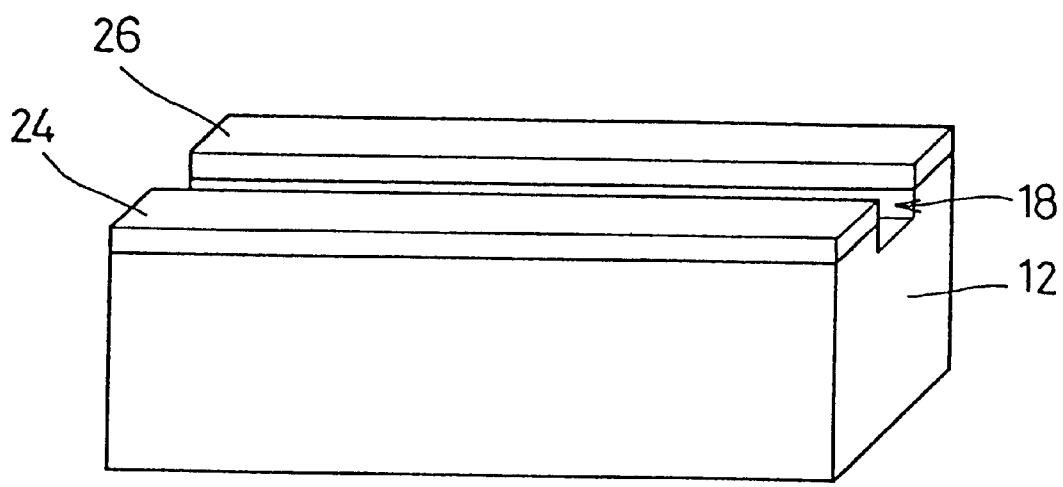
FIG. 1 is a perspective view illustrating a preferred embodiment of a piezoelectric resonator according to the present invention.
Figure 2:
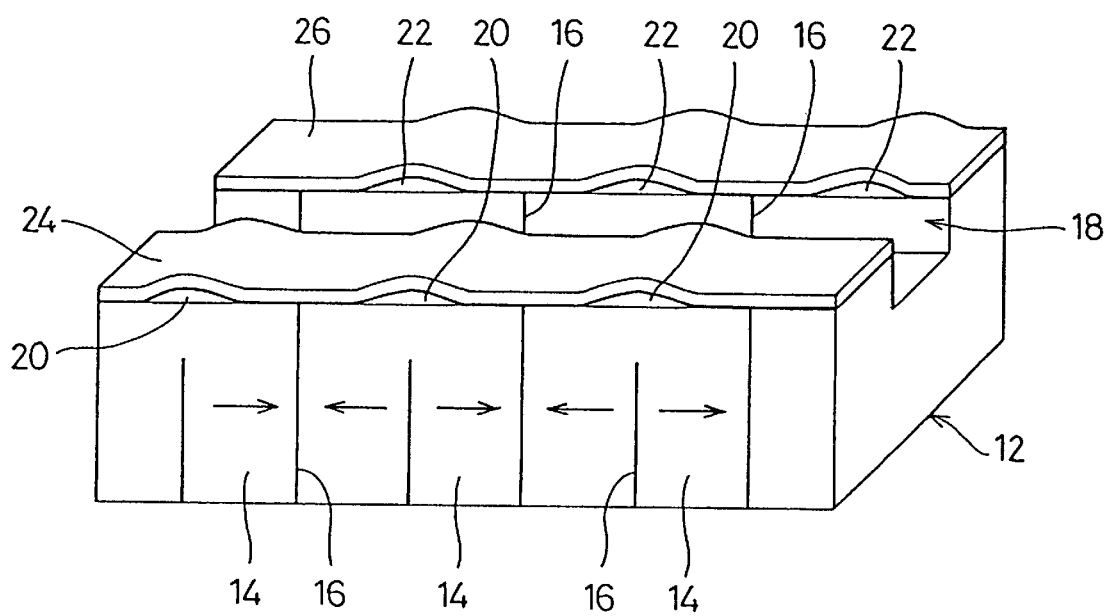
FIG. 2 is an illustration showing the piezoelectric resonator shown in FIG. 1.

FIG. 1 is a perspective view illustrating a preferred embodiment of a piezoelectric resonator according to the present invention. FIG. 2 is an illustration showing the preferred embodiment of FIG. 1.

A piezoelectric resonator 10 includes a base member 12 including alternately laminated piezoelectric layers 14 and internal electrodes 16. One of the piezoelectric layers 14 is interposed between internal electrodes 16 and an adjacent piezoelectric layer 14 and the internal electrode 16 located therebetween is polarized, as indicated by the arrows shown in FIG. 2, in opposite directions in the longitudinal direction of the base member 12. However, the piezoelectric layers 14 which are positioned at both ends of the base member 12 in the longitudinal direction thereof are preferably not polarized. The piezoelectric layers 14 positioned at both ends of the base member 12 may be, however, polarized as desired. Additionally, unpolarized piezoelectric layers may be provided at any positions of the base member.

Figure 3A:
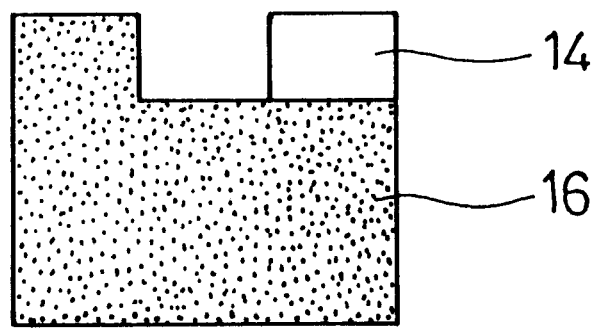
FIG. 3 is an illustration showing the relationship of the internal electrodes to a laminated structure for use in the piezoelectric resonator shown in FIG. 2.
Figure 3B:
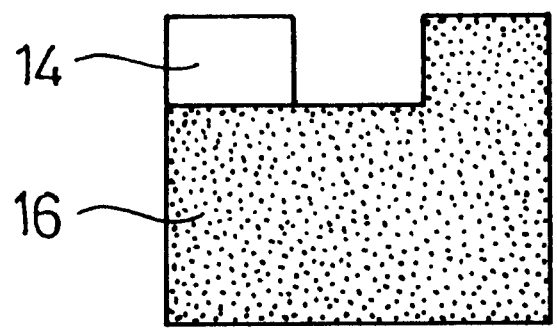

On one lateral surface of the base member 12, a groove 18 extending in the longitudinal direction of the base member 12 is formed at an approximate central portion of the width of the base member 12. On one lateral surface of the groove 18, a first region is provided in which a first group of the internal electrodes 16 are exposed at every other layer. On the other lateral surface of the groove 18, a second region is provided in which a second group of the internal electrodes 16 which are not exposed in the first region are exposed at every other layer. In the above piezoelectric resonator 10, the first and second groups of the internal electrodes 16 exposed at the respective sides of the groove, as illustrated in FIGS. 3(a) and 3(b), are alternately laminated. In the first region, a first insulating film 20 is disposed at a position corresponding to the unexposed portion of each internal electrode 16. Similarly, in the second region, a second insulating film 22 is disposed at a position corresponding to the unexposed portion of each internal electrode 16.

In this preferred embodiment, a PZT ceramic having a relative dielectric constant of approximately 1000 is preferably used to form the piezoelectric layer 14. An epoxy resin having a relative dielectric constant of from about 2 to about 5 is used to form the first and second insulating films 20 and 22. As the first and second insulating films 20 and 22, a material other than an epoxy resin may be used as long as the material has a dielectric constant that is lower than the piezoelectric layer 14. Moreover, as the piezoelectric layer 14, a piezoelectric material other than a PZT ceramic may be used. For example, the insulating films 20 and 22 may have a plurality of metal particles contained therein.

Further, on one side of the groove 18, a first external electrode 24 is provided on the first region of the base member 12 on which the first insulating film 20 is disposed. Accordingly, the exposed internal electrodes 16 in the first region are electrically connected to the first external electrode 24. On the other side of the groove 18, a second external electrode 26 is provided on the second region of the base member 12 on which the second insulating film 22 is disposed. Thus, the exposed internal electrodes 16 in the second region are electrically connected to the second external electrode 26. It should be noted that the first and second external electrodes 24 and 26 are provided in the form of a thin film produced preferably by sputtering or other suitable process. Further, it is not essential that the internal electrodes 16 formed within the base member 12 are alternately connected to the different external electrodes. For example, the adjacent internal electrodes 16 may be connected to the same external electrode, or some internal electrodes may be connected to neither of the external electrodes.

Figure 2A:
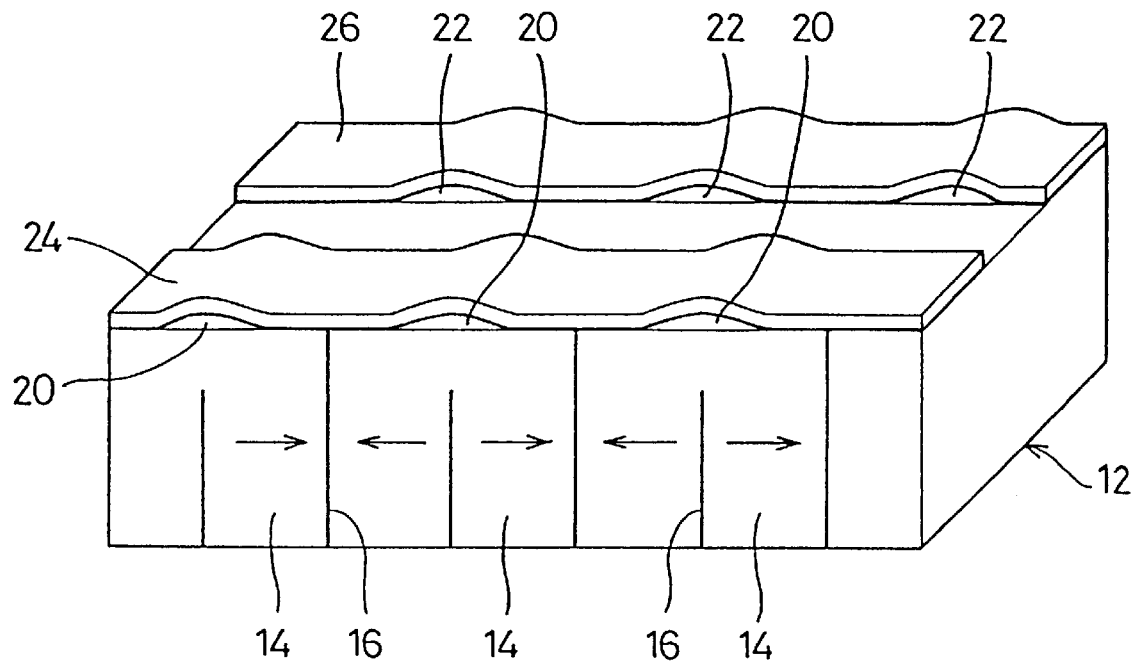
FIG. 2A is an illustration showing a modification of the piezoelectric resonator shown in FIG. 1.

In the piezoelectric resonator shown in FIGS. 1 and 2, the groove 18 is provided. However, it is noted that the groove 18 is not an essential feature for the present invention and may be omitted. As shown in FIG. 2A, the piezoelectric resonator having the features of FIG. 1 without the groove 18 is also possible.

Figure 4:
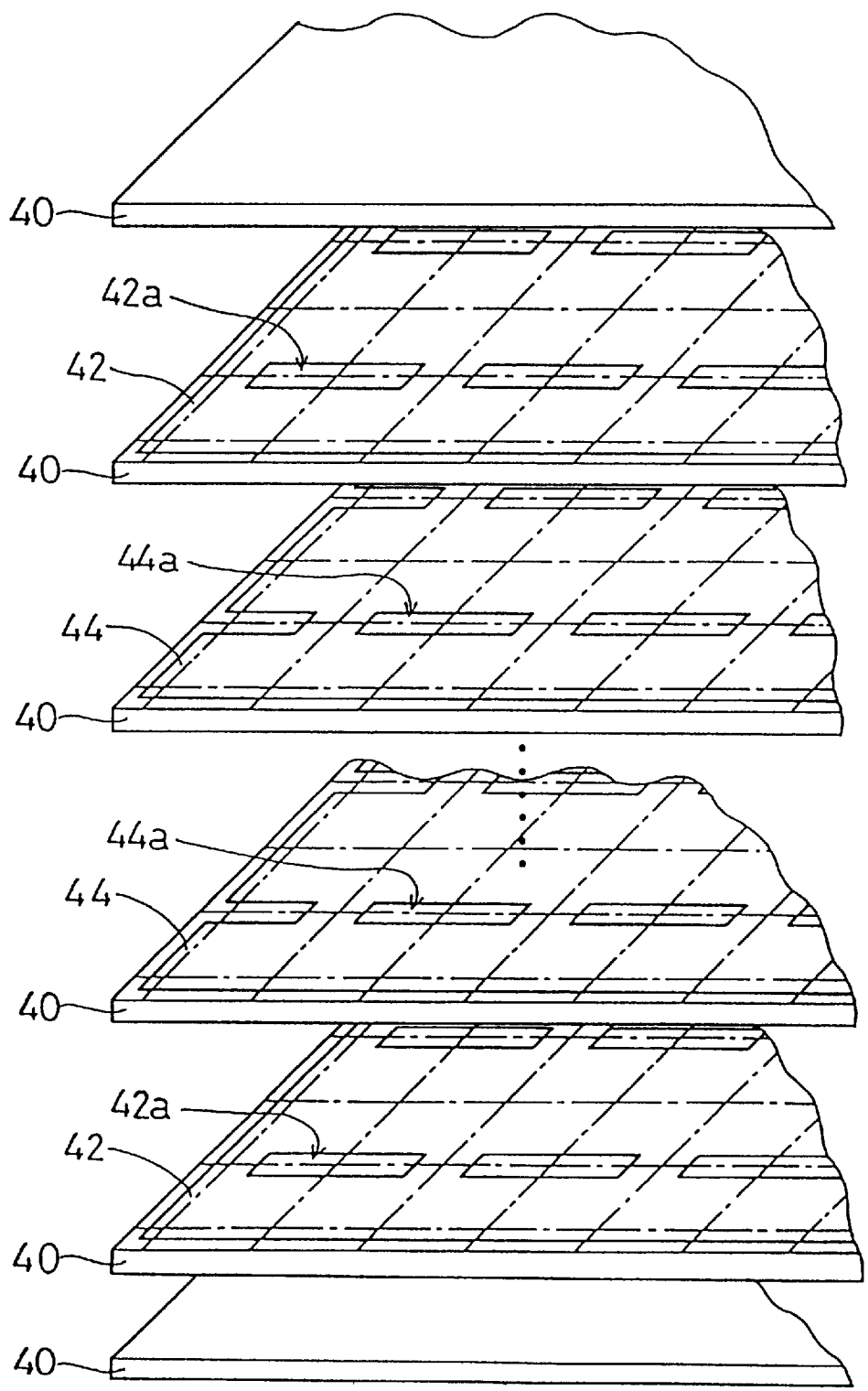
FIG. 4 is a perspective view illustrating the state in which mother substrates are laminated to produce the piezoelectric resonator shown in FIG. 1.

For manufacturing the piezoelectric resonator 10, as shown in FIG. 4, piezoelectric-ceramic mother substrates 40, which will be used form a large number of piezoelectric layers 14, are first prepared. Mother electrodes 42, 44 are formed on each mother substrate 40 and will be used to form the internal electrodes 16. The mother electrodes 42 and 44 have electrode-free portions 42a and 44a, respectively, and the mother substrates 40 are alternately laminated in such a manner that the electrode-free portions 42a and the electrode-free portions 44a are separated from each other. A laminated structure obtained according to the above procedure is then cut at portions indicated by the one-dot-chain lines extending in the transverse direction shown in FIG. 4.

Figure 5:
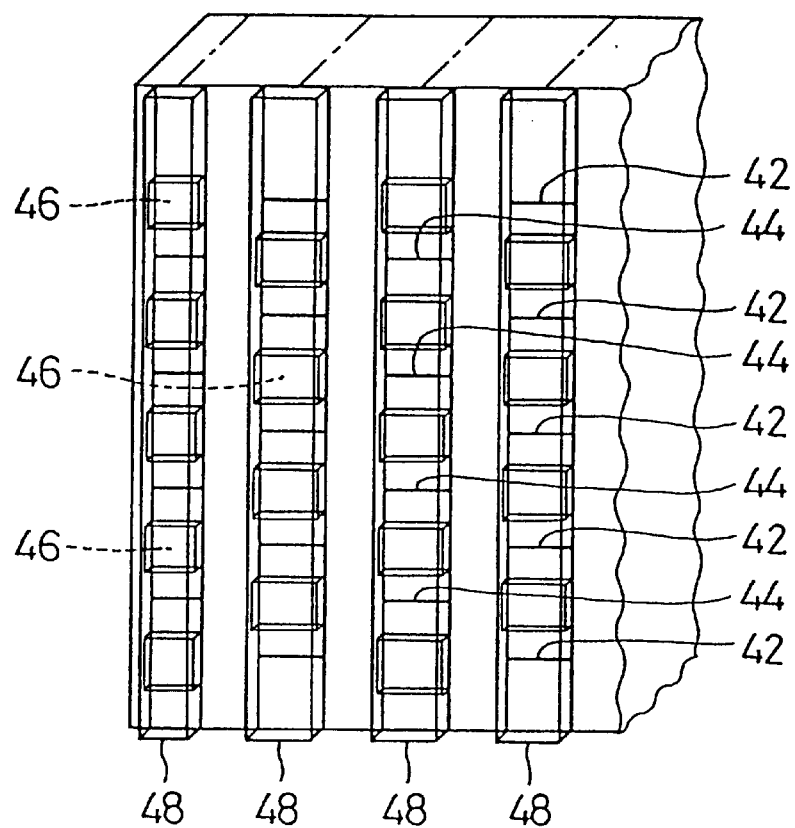
FIG. 5 is an illustration showing the state in which insulating materials and electrodes are formed on a laminated structure which is obtained by laminating the mother substrates shown in FIG. 4.

An insulating material 46, which will form the first insulating film 20 and the second insulating film 22, is applied, as shown in FIG. 5, to the cross-sectional surface of the cut laminated structure. For the convenience of explanation, the number of layers in this laminated structure illustrated in FIG. 5 does not coincide with the number of piezoelectric layers of the base member 12 shown in FIG. 2. The insulating material 46 is formed on the unexposed portions of the mother electrodes 42 and 44. Further, a plurality of electrodes 48, which will form the external electrodes 24 and 26, are disposed in a direction that is perpendicular to the surfaces of the mother electrodes 42 and 44. Then, a high DC voltage is applied between the adjacent electrodes 48, thereby polarizing the individual mother substrates 40. Subsequently, the laminated structure is cut at the portions represented by the one-dot-chain lines shown in FIG. 5, and a groove is preferably formed at the center of each cut piece. Thus, the piezoelectric resonator 10 is produced. The provision of the groove 18 is not essential, and it is sufficient if the external electrodes 24 and 26 disposed on both sides of the resonator 10 are separated from each other.

In this piezoelectric resonator 10, a signal is supplied between the first external electrode 24 and the second external electrode 26. This makes it possible to apply reverse-polarity voltages to the respective piezoelectric layers 14 of the base member 12, thereby causing the entire base member 12 to expand and contract in the same direction. Therefore, the base member 12 is vibrated in a longitudinal fundamental vibration such that a vibration node is defined at an approximate center of the base member 12.

In this piezoelectric resonator 10, the direction of polarization of the piezoelectric layers 14 and the direction of an electric field generated by the signal coincide with the direction of vibration. Thus, the piezoelectric resonator 10 is a stiffened-mode piezoelectric resonator. The stiffened-mode piezoelectric resonator 10 has a larger electromechanical coupling coefficient and a greater difference ΔF between the resonant frequency and the anti-resonant frequency as compared to an unstiffened-mode piezoelectric resonator in which the direction of polarization and the direction of an electric field are different from the direction of vibration.

Moreover, the first insulating film 20 and the second insulating film 22, both of which are preferably made from a resin having a dielectric constant smaller than the piezoelectric layers 14, are provided at positions corresponding to the unexposed portions of the first and second groups of the internal electrodes 16. Accordingly, the first insulating film 20 is interposed between the second group of the internal electrodes 16 and the first external electrode 24, and the second insulating film 22 is interposed between the first group of the internal electrodes 16 and the second external electrode 26. This decreases the capacitance generated between the internal electrodes 16 and each of the first and second external electrodes 24 and 26. Hence, a reduction in the difference Δf between the resonant frequency and the anti-resonant frequency of the resonator is prevented as compared to a piezoelectric resonator without an insulating film. Further, the area of the first insulating film 20 and the second insulating film 22 can be changed to vary the capacitance formed between the second group of internal electrodes 16 and the first external electrode 24, and the capacitance formed between the first group of internal electrodes 16 and the second external electrode 26.

This makes it possible to form a piezoelectric resonator having various values of Δf, thereby increasing the design flexibility for such a resonator.

Figure 6:
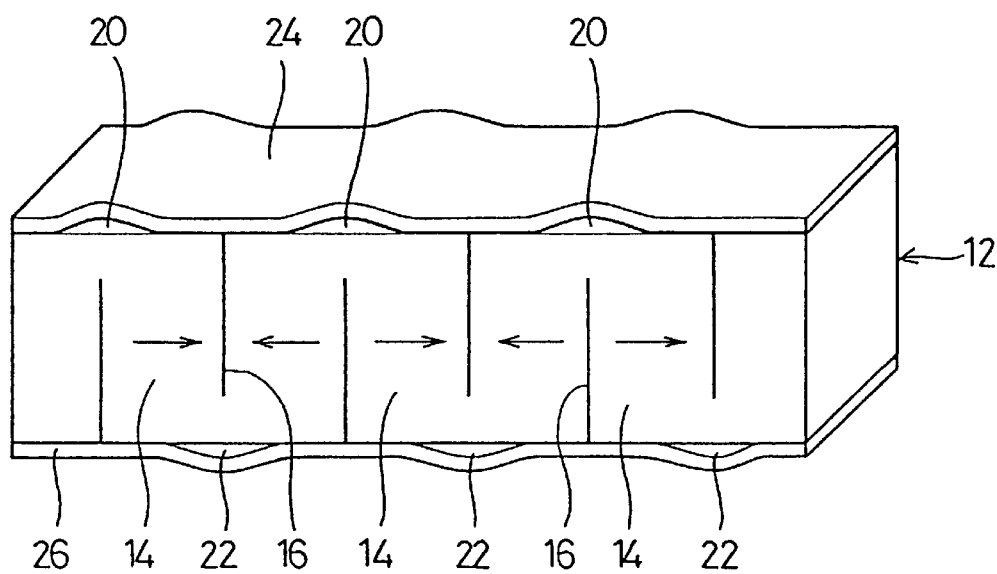
FIG. 6 is an illustration showing another preferred embodiment of a piezoelectric resonator according to the present invention.
Figure 7A:
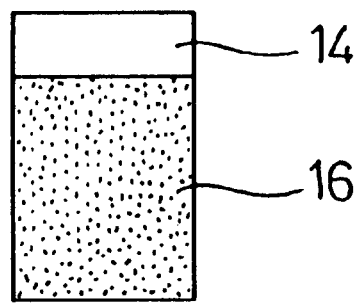
FIG. 7 is an illustration showing the relationship of the internal electrodes to a laminated structure for use in the piezoelectric resonator shown in FIG. 6.
Figure 7B:
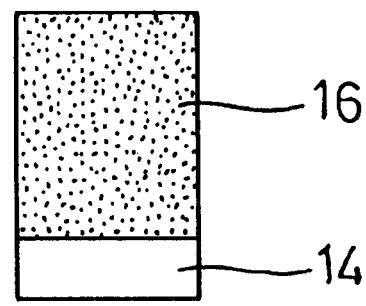

Alternatively, as illustrated in FIG. 6, a first region and a second region may be formed on the opposite surfaces of the base member 12, and the first and second groups of internal electrodes 16 may be alternately extended to the opposing lateral surfaces of the base member 12. In this case, the first and second group of the internal electrodes 16 extended to the opposite portions of the piezoelectric layers 14, as illustrated in FIGS. 7(a) and 7(b), may be alternately laminated, thereby forming a piezoelectric resonator 10. Then, first and second insulating films 20 and 22 may be formed at positions corresponding to unexposed portions of the first and second groups of the internal electrodes 16, and first and second external electrodes 24 and 26 may be provided on the opposite surfaces of the base member 12 on which the insulating films 20 and 22 are disposed. In this piezoelectric resonator 10, as well as in the counterpart shown in FIG. 2, the formation of the first insulating film 20 decreases the capacitance generated between the second group of internal electrodes 16 and the first external electrode 24, and the formation of the second insulating film 22 decreases the capacitance generated between the first group of internal electrodes 16 and the second external electrode 26.

Figure 8:
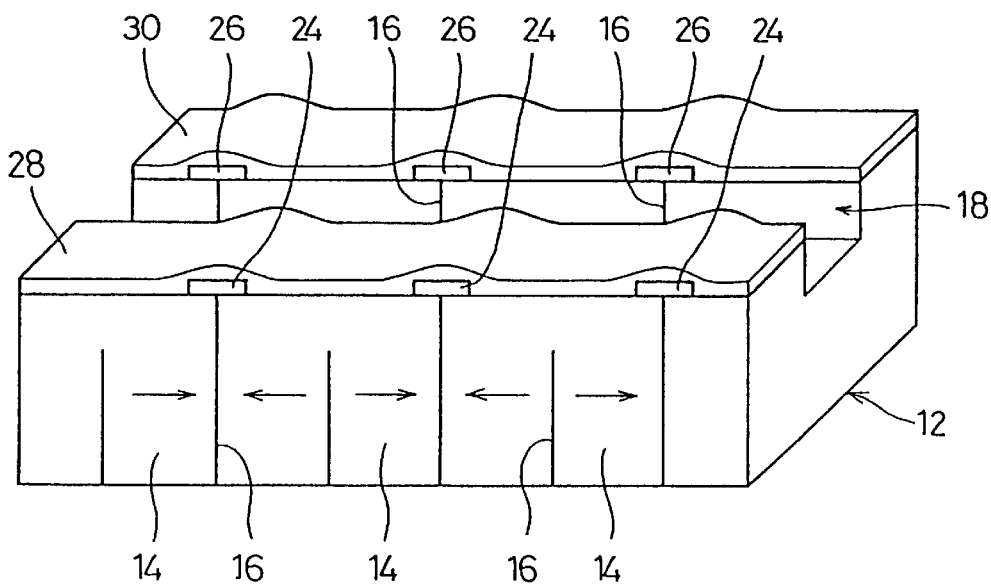
FIG. 8 is an illustration showing still another preferred embodiment of a piezoelectric resonator according to the present invention.

Alternatively, as illustrated in FIG. 8, a first external electrode 24 may be provided only on each exposed portion of the first group of internal electrodes 16 in the first region of the base member 12, while a second external electrode 26 may be provided only on each exposed portion of the second group of internal electrodes 16 in the second region. Then, a first conductive resin film 28 and a second conductive resin film 30 may be disposed on the first and second external electrodes 24 and 26, respectively. Accordingly, the first and second conductive resin films 28 and 30 are electrically connected to the first and second groups of internal electrodes 16 which are connected to the first and second electrodes 24 and 26, respectively.

In the above piezoelectric resonator 10, as well as in the other resonators according to preferred embodiments of the present invention, a signal is input between the first conductive resin film 28 and the second conductive resin film 30, which makes it possible to apply an electric field to the piezoelectric layers 14, thereby exciting a longitudinal vibration in the base member 12. In the conductive resin films 28 and 30, metal particles are preferably uniformly distributed in the insulating resin which has a dielectric constant which is smaller than the piezoelectric layer 14. Thus, the metal particles in the conductive resin films 28 and 30 on the base member 12 are almost in point-contact with the base member 12, thereby significantly decreasing the area of contact compared to a piezoelectric resonator in which external electrodes are provided on the entire surfaces of the first region and the second region. Consequently, the capacitance generated between the unexposed portion of the second group of internal electrodes 16 and the first conductive resin film 28 and the capacitance generated between the unexposed portion of the first group of internal electrodes 16 and the second conductive resin film 30 is significantly smaller than that generated in a piezoelectric resonator having external electrodes disposed on the entire surface. Additionally, the first and second external electrodes 24 and 26 are arranged in such a manner that they are respectively connected to the exposed portions of the first and second groups of internal electrodes 16, thereby increasing the area of contact between the first and second external electrodes 24, 26 and the first and second conductive resin films 28, 30, respectively. Hence, an electrical connection between the first group of internal electrodes 16 and the first conductive resin film 28, and an electrical connection between the second group of internal electrodes 16 and the second conductive resin film 30 is greatly enhanced.

Figure 9:
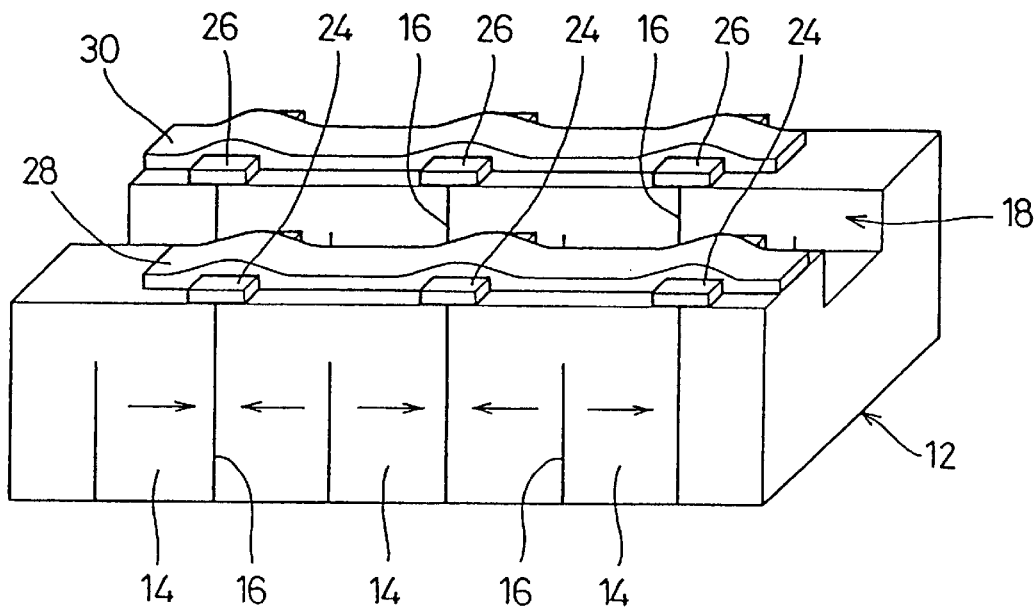
FIG. 9 is an illustration showing a further preferred embodiment of a piezoelectric resonator according to the present invention.

It is not necessary to provide the first and second conductive resin films 28 and 30 on the entire surfaces of the first region and the second region of the base member 12. The conductive resin films 28 and 30 may be provided, as illustrated in FIG. 9, only on part of the surface of the base member 12. In the piezoelectric resonator 10 shown in FIG. 9, as well as in the other resonators of the preferred embodiments, a signal is supplied between the first and second conductive resin films 28 and 30, thereby making it possible to generate a longitudinal vibration in the base member 12. Further, since the conductive resin has the function of damping the vibration of the piezoelectric resonator, Qm of the piezoelectric resonator 10 is reduced according to increased areas of the conductive resin film 28 or 30. Accordingly, the area or the configuration of the conductive resin film 28 or 30 can be changed to adjust Qm of the piezoelectric resonator 10. A change in the area of the conductive resin film 28 or 30 also varies the capacitance generated between the second group of internal electrodes 16 and the first conductive resin film 28 and the capacitance generated between the first group of internal electrodes 16 and the second conductive resin film 30, thereby obtaining a piezoelectric resonator 10 exhibiting various values of Δf.

Figure 10:
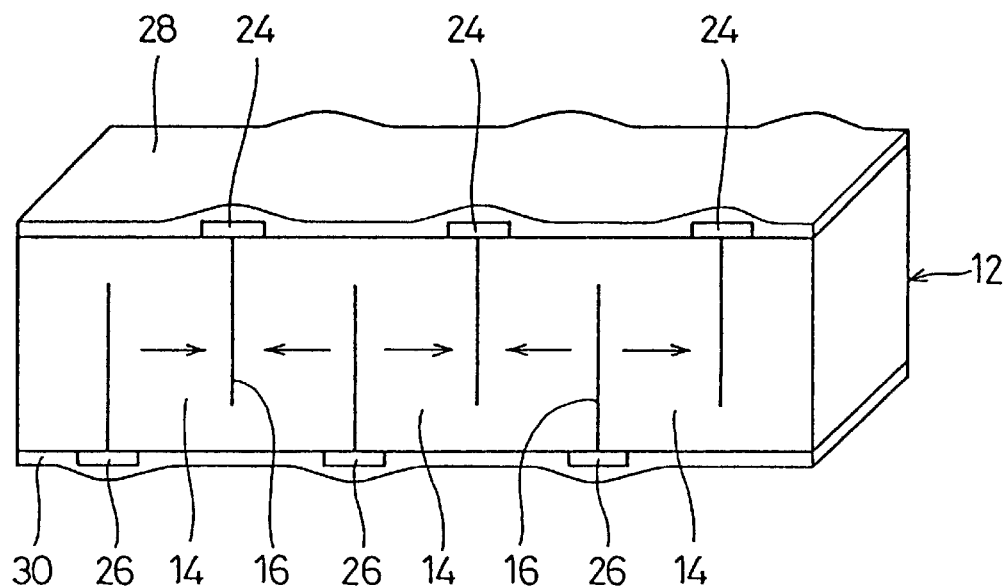
FIG. 10 is an illustration showing another preferred embodiment of a piezoelectric resonator according to the present invention.

Furthermore, as shown in FIG. 10, first and second regions may be located on the opposite surfaces of the base member 12, and the first and second external electrodes 24 and 26 and the first and second conductive resin films 28 and 30 may be provided on the opposite surfaces of the base member 12. In the piezoelectric resonator illustrated in FIG. 10, as well as in the other resonators of preferred embodiments of the present invention, the first and second conductive resin films 28 and 30 may certainly be provided only on part of the surface of the base member 12.

Figure 11:
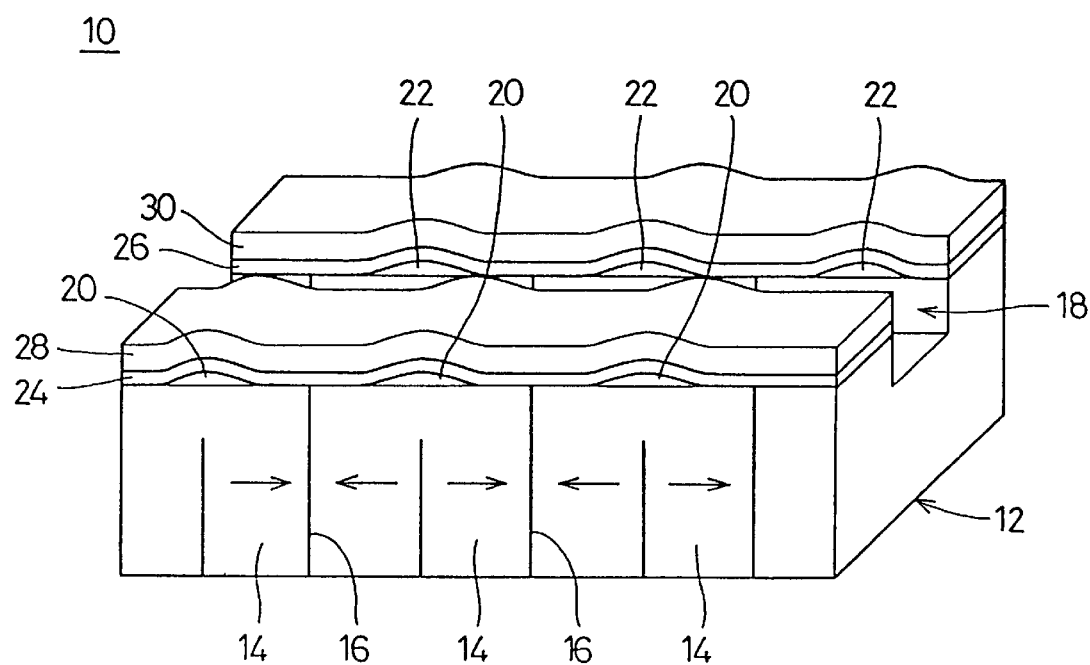
FIG. 11 is an illustration showing a further preferred embodiment of a piezoelectric resonator according to the present invention.

The first and second conductive resin films 28 and 30 may be disposed, as illustrated in FIG. 11, on the first and second external electrodes 24 and 26, respectively, of the piezoelectric resonator shown in FIG. 2. In this case, even if the external electrode 24 or 26 is broken due to expansion and contraction of the first insulating film 20 or the second insulating film 22 resulting form a temperature change caused by, for example, a heat shock, the continuity of the external electrode 24 or 26 across the broken portion can be ensured by the provision of the conductive resin film 28 or 30. Thus, the function of the piezoelectric resonator 10 can be ensured despite the broken external electrode 24 or 26. Moreover, the area or the configuration of the conductive resin film 28 or 30 can be changed to adjust Qm of the piezoelectric resonator 10. In a piezoelectric resonator in which the external electrodes 24 and 26 are provided on the entire opposite surfaces of the base member 12, such as the one shown in FIG. 6, the conductive resin films 28 and 30 may be provided on the respective external electrodes 24 and 26. In this case, advantages similar to those offered by the other resonators according to preferred embodiments of the present invention are obtained.

Figure 12:
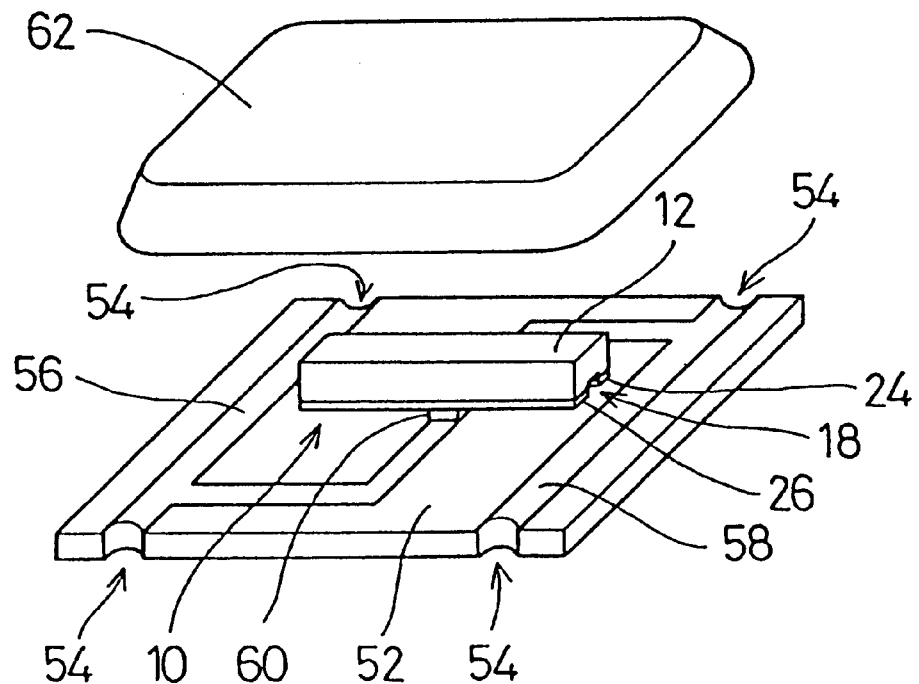
FIG. 12 is an exploded perspective view illustrating a preferred embodiment of an electronic component formed by using the piezoelectric resonator of the present invention.

By using the foregoing piezoelectric resonator 10, electronic components, such as oscillators and discriminators, are manufactured. FIG. 12 is a perspective view illustrating a preferred embodiment of an electronic component 50. The piezoelectric resonator 10 shown in FIG. 2 is incorporated in this preferred embodiment shown in FIG. 12. The electronic component 50 has an insulating substrate 52. Four indentations 54, two for opposing ends of the insulating substrate 52, are provided. Two pattern electrodes 56 and 58 are provided on one surface of the insulating substrate 52. One pattern electrode 56 is provided between the opposing indentations 54 and is arranged in the shape of an L from one end of the electrode 56 to the central portion of the insulating substrate 52. The other pattern electrode 58 is provided between the other opposing indentations 54 and is arranged in the shape of an L from one end of the electrode 58, which is opposite to the above-described end of the electrode 56, to the central portion of the insulating substrate 52. The two pattern electrodes 56 and 58 are separated from each other via a gap formed therebetween in the vicinity of the central portion of the insulating substrate 52. As the insulating substrate 52, a known substrate, such as a glass epoxy substrate or an alumina substrate, may be used. Alternatively, a dielectric substrate may be used.

Provided on the first and second external electrodes 24, 26 of the piezoelectric resonator 10 and substantially at the central portion of the base member 12 is a mounting member 60 made of, for example, a conductive adhesive. The mounting member 60 is then connected and fixed on the pattern electrodes 56 and 58 preferably via a conductive adhesive (not shown) provided on the ends of the pattern electrodes 56 and 58 which are placed at the central portion of the insulating substrate 52. Accordingly, the external electrodes 24 and 26 of the piezoelectric resonator 10 can be fixed on the insulating substrate 52 and electrically connected to the pattern electrodes 56 and 58. Further, a metallic cap 62 is placed on the substrate 52 to cover the insulating substrate 52. At this time, an insulating resin is applied to the insulating substrate 52 and each of the pattern electrodes 56 and 58 in order to prevent an electrical connection between the metallic cap 62 and each of the pattern electrodes 56 and 58. The metallic cap 62 covers the insulating substrate 52, thereby completing the electronic component 50.

In the above-described electronic component 50, by the provision of the mounting member 60 disposed on the external electrodes 24 and 26 of the piezoelectric resonator 10, the edges of the piezoelectric resonator 10 can be positioned away from the insulating substrate 52, and thus, the vibration of the resonator 10 is not hindered. Moreover, the central portion of the piezoelectric resonator 10, which has a vibration node defined thereat, is reliably supported by the mounting member 60, thereby preventing a leakage of vibration of the piezoelectric resonator 10.

Figure 13:
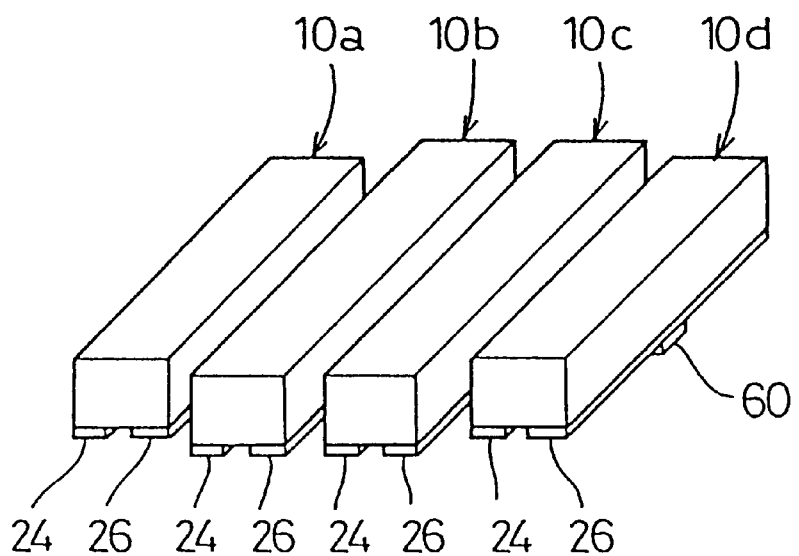
FIG. 13 is an exploded perspective view illustrating the essential portion of a preferred embodiment of a ladder filter formed by using the piezoelectric resonator of the present invention.
Figure 13:
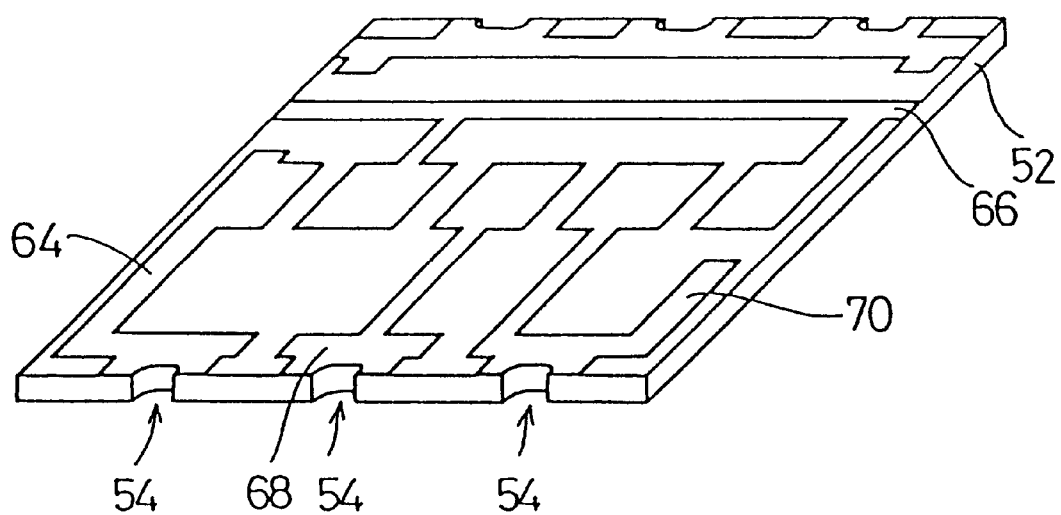

Further, by using a plurality of piezoelectric resonators 10 constructed according to the above-described preferred embodiments, a ladder filter can be manufactured. FIG. 13 is a perspective view illustrating the essential portion of an electronic component used as a ladder filter and having a ladder circuit. In the electronic component 50 illustrated in FIG. 13, four pattern electrodes 64, 66, 68, and 70 are disposed on an insulating substrate 52. Five lands are provided for the pattern electrodes 64, 66, 68 and 70, which lands are aligned with each other with a spacing therebetween. In this case, the first land as viewed from one end of the insulating substrate 52 is provided for the pattern electrode 64, the second and the fifth lands are provided for the pattern electrode 66, the third land is provided for the pattern electrode 68, and the fourth land is provided for the pattern electrode 70.

Figure 14:
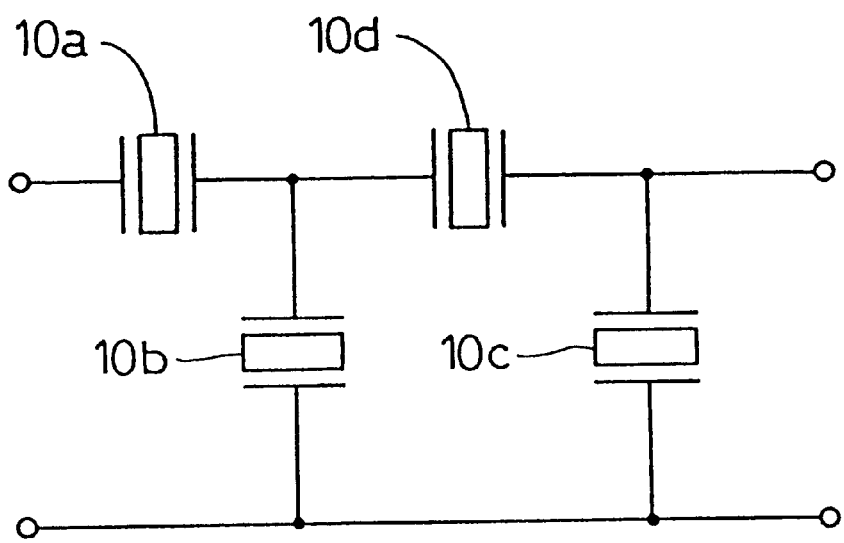
FIG. 14 is a circuit diagram illustrating the ladder filter shown in FIG. 13.
Figure 15:
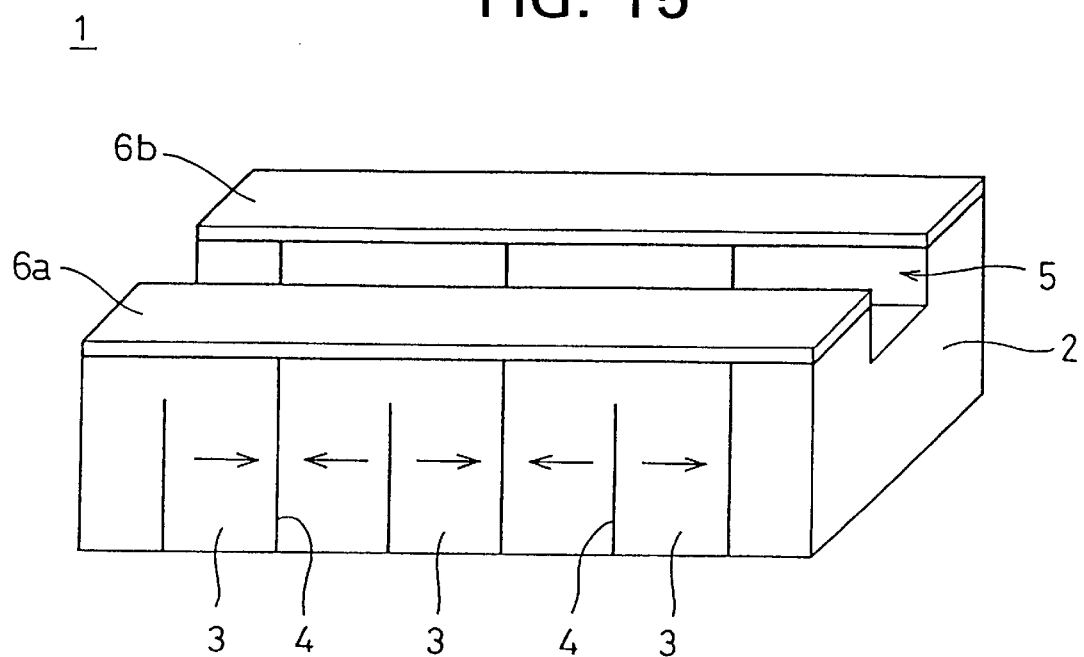
FIG. 15 is an illustration showing an example of a piezoelectric resonator relating to a background of the present invention.

The piezoelectric resonator 10 provided with the mounting member 60 on the external electrodes 24 and 26 is fixed at the mounting member 60 on the respective lands of the substrate 52 with a conductive adhesive. In this case, piezoelectric resonators 10a through 10d are mounted on the substrate 52 in order to obtain the ladder circuit shown in FIG. 14. Then, a metallic cap (not shown) is placed on the substrate 52 to cover the insulating substrate 52.

In the electronic components shown in FIGS. 12 and 13, piezoelectric resonators having a small capacitance between the second group of internal electrodes 16 and the first external electrodes 24 and between the first group of the internal electrodes 16 and the second external electrodes 26 can be used, thereby prevent a reduction in $\Delta f$.

Accordingly, a decrease in the bandwidth is prevented in the electronic component 50, such as a ladder filter. As the piezoelectric resonators 10 for use in the electronic components 50, not only the resonator 10 shown in FIG. 2, but also the resonators illustrated in FIGS. 6, 8 through 11 may be used, in any combination. In particular, if the piezoelectric resonator 10 shown in FIG. 8 or 9 is used in the electronic component 50, the first and second conductive resin films 28 and 30 are attached to the mounting member 60, in which case, Qm of the electronic component 50 can be easily and accurately adjusted.

In the ladder filter illustrated in FIG. 13, the capacitance between the internal electrodes of each of the parallel resonators 10b and 10c is preferably set to be sufficiently greater than that of the series resonators 10a and 10d. Consequently, in using piezoelectric resonators having a laminated structure, the number of laminated layers of the series resonators 10a and 10d is preferably small, resulting in a relatively large spacing between the internal electrodes 16. On the other hand, the number of layers of the parallel resonators 10b and 10c is preferably large, resulting in a small spacing between the internal electrodes 16. A reduction in $\Delta f$ is noticeably achieved by the series resonators 10a and 10d having a small capacitance between the internal electrodes and is not significantly observed by the parallel resonators 10b and 10c having a large capacitance. Further, it is easy to partially form the insulating films 20 and 22, as shown in FIG. 2, and to partially form the external electrodes 24 and 26, as illustrated in FIG. 8, in the series resonators 10a and 10d having a large spacing between the internal electrodes 16. It is, however, rather difficult to partially form the above components in the parallel resonators 10b and 10c having a small spacing between the internal electrodes 16. Considering the above correlation, the piezoelectric resonator 10 of preferred embodiments of the present invention are used preferably for the series resonators 10a and 10d in the ladder filter 50 shown in FIG. 12, thereby implementing an easy-to-form ladder filter that prevents a decrease in the bandwidth.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator, comprising:
   a piezoelectric resonator including a base member having a longitudinal direction and including a plurality of laminated piezoelectric layers and internal electrodes, the piezoelectric layers being polarized in the longitudinal direction of the base member and arranged to generate a longitudinal vibration in the base member such that a vibration node at which point substantially no vibration occurs is defined at an approximate center of the base member;
   a first group of the internal electrodes and second group of the internal electrodes being exposed at respective first and second regions of a surface of the base member;
   first and second external electrodes respectively disposed on the first and second regions so as to be connected to the first and second groups of the internal electrodes; and an insulating film arranged to cover an unexposed portion of each of the first and second groups of the internal electrodes, the insulating film is disposed on each of the first and second regions and has a dielectric constant smaller than a dielectric constant of the piezoelectric layers.

2. The piezoelectric resonator according to claim 1, wherein said first and second regions are respectively located at a first side and a second side of said base member on a common lateral surface of said base member.

3. The piezoelectric resonator according to claim 1, wherein said first and second regions are located on different lateral surfaces of said base member.

4. The piezoelectric resonator according to claim 1, wherein a groove is formed along the longitudinal direction of said base member and separates said first and second regions and said first and second external electrodes.

5. The piezoelectric resonator according to claim 1, wherein selected ones of the piezoelectric layers are not polarized.

6. The piezoelectric resonator according to claim 1, wherein the insulating film includes an epoxy resin material.

7. The piezoelectric resonator according to claim 1, wherein the insulating film includes a plurality of metal particles contained therein.

8. The piezoelectric resonator according to claim 1, wherein a direction of polarization of the piezoelectric layers, a direction of application of an electric field to the piezoelectric layers and a vibration direction are the same.

9. A piezoelectric resonator, comprising:

a piezoelectric resonator including a base member having a longitudinal direction and including a plurality of laminated piezoelectric layers and internal electrodes, the piezoelectric layers being polarized in the longitudinal direction of the base member and arranged to generate longitudinal vibration in the base member such that a vibration node at which point substantially no vibration occurs is defined at an approximate center of the base member;

a first group of the internal electrodes and a second group of the internal electrodes being exposed at respective first and second regions of a surface of the base member;

first and second external electrodes respectively disposed on the first and second regions so as to be connected to the first and second groups of the internal electrodes; and first and second conductive resin films respectively disposed on said first and second regions so as to be connected to said external electrodes.

10. The piezoelectric resonator according to claim 9, wherein the first and second external electrodes are disposed between the first and second conductive resin films and the first and second groups of internal electrodes.

11. The piezoelectric resonator according to claim 9, wherein said first and second regions are respectively located at a first side and a second side of said base member on a common lateral surface of said base member.

12. The piezoelectric resonator according to claim 9, wherein said first and second regions are located on different lateral surfaces of said base member.

13. The piezoelectric resonator according to claim 9, wherein a groove is formed along the longitudinal direction of said base member and separates said first and second regions and said first and second external electrodes.

14. The piezoelectric resonator according to claim 9, wherein selected ones of the piezoelectric layers are not polarized.

15. The piezoelectric resonator according to claim 9, wherein the first and second resin films include an epoxy resin material.

16. The piezoelectric resonator according to claim 9, wherein the first and second resin films include a plurality of metal particles contained therein.

17. The piezoelectric resonator according to claim 9, wherein a direction of polarization of the piezoelectric layers, a direction of application of an electric field to the piezoelectric layers and a vibration direction are the same.

18. An electronic component comprising:

at least one piezoelectric resonator including:
a base member having a longitudinal direction and including a plurality of laminated piezoelectric layers and internal electrodes, the piezoelectric layers being polarized in the longitudinal direction of the base member and arranged to generate a longitudinal vibration in the base member such that a vibration node at which point substantially no vibration occurs is defined at an approximate center of the base member;

a first group of the internal electrodes and a second group of the internal electrodes being exposed at respective first and second regions of a surface of the base member;

first and second external electrodes respectively disposed on the first and second regions so as to be connected to the first and second groups of the internal electrodes; and an insulating film arranged to cover an unexposed portion of each of first and second groups of the internal electrodes, the insulating film is disposed on each of the first and second regions and has a dielectric constant smaller than a dielectric constant of the piezoelectric layers;

a substrate arranged to support the piezoelectric resonator and including a pattern electrode which is electrically connected to the at least one resonator; and a cap covering said substrate and said piezoelectric resonator.

19. The electronic component according to claim 18, further comprising a plurality of said piezoelectric resonators, wherein a plurality of said pattern electrodes are provided on said substrate and said plurality of said piezoelectric resonators are electrically connected to said pattern electrodes so that a ladder filter is provided.

20. The electronic component according to claim 18, further comprising:

first, second, third and fourth base members;

first, second, third and fourth pattern electrodes defining electrodes on said substrate; wherein
said first base member is mounted on said first and second pattern electrodes;
said second base member is mounted on said second and third pattern electrodes;
said third base member is mounted on said second and fourth pattern electrodes; and
said fourth base member is mounted on said third and fourth pattern electrodes.

* * * * *